US008274421B2

(12) United States Patent
Rey-Losada (10) Patent No.: US 8,274,421 B2
(45) Date of Patent: Sep. 25, 2012

(54) SYSTEM FOR DIGITIZING A PARAMETER HAVING AN UNKNOWN VALUE

(75) Inventor: Daniel Rey-Losada, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 53 days.

(21) Appl. No.: 12/837,817

(22) Filed: Jul. 16, 2010

(65) Prior Publication Data

US 2012/0013495 A1    Jan. 19, 2012

(51) Int. Cl.
*H03M 1/34* (2006.01)
(52) U.S. Cl. ................. 341/163; 341/155; 341/161
(58) Field of Classification Search .......... 341/161, 341/158, 163, 155, 154
See application file for complete search history.

(56) References Cited

U.S. PATENT DOCUMENTS

| 4,654,635 | A | * | 3/1987 | Van De Plassche | 341/156 |
| 5,633,636 | A | * | 5/1997 | Reyhani | 341/97 |
| 6,215,302 | B1 | | 4/2001 | Carey | 324/252 |
| 6,225,802 | B1 | | 5/2001 | Ramalho et al. | 324/252 |
| 6,891,495 | B2 | * | 5/2005 | Chen et al. | 341/161 |
| 2002/0036582 | A1 | * | 3/2002 | Liu et al. | 341/158 |

OTHER PUBLICATIONS

PCT Notification of the International Search Report and the Written Opinion of the International Searching Authority, Dated Dec. 2, 2011, for International Application No. PCT/US2011/001107.

\* cited by examiner

*Primary Examiner* — Jean B Jeanglaude
(74) *Attorney, Agent, or Firm* — Koppel, Patrick, Heybl & Philpott (57) ABSTRACT

A system for digitizing the magnitude of a first parameter, which can be inferred by applying to a second parameter and digitizing the magnitude of a resulting third parameter. The circuit which applies the second parameter has an associated bias point with which the magnitude of the second parameter varies. The value of the first parameter can result in an error in the value of the second parameter which results in an error being incurred when the digitized value of the third magnitude is used to infer a digitized value of the magnitude of the first parameter. This is avoided by adjusting the bias point with each successive trial and employing a sequential-trial ADC which performs sequential comparisons between the third magnitude and respective decision thresholds, such that there is no error in the magnitude of the second parameter when the third magnitude is equal to the decision threshold for a particular trial.

18 Claims, 6 Drawing Sheets

SYSTEM FOR DIGITIZING A PARAMETER HAVING AN UNKNOWN VALUE

BACKGROUND OF THE INVENTION

1. Field of the Invention

This invention relates generally to circuits designed to digitize a parameter having an unknown value.

2. Description of the Related Art

There are many applications in which it is desirable to digitize the value of a parameter having an unknown value. For example, a resistor may be used as a means to configure an integrated circuit (IC) to operate in one of several possible modes of operation determined by the value of the resistance. When the configuration means requires that the resistance value be presented in digital form, a resistance digitizer (or resistance-to-digital (R-to-D) converter) is needed.

One possible implementation of an R-to-D converter uses a dedicated 'reference resistor', in which a circuit compares the resistance of the resistor to be measured to that of the resistor that is used as a reference. This requires a reference resistor of known value; any error between the actual and assumed values of the reference resistor will translate into a digitization error. Fabricating accurate resistors to be used as reference resistors in an IC is difficult because the accuracy to which they can be (cheaply) fabricated is around ±20%. Additionally, such resistors typically have a significant temperature dependency. Therefore, it is difficult to achieve a digitization accuracy better than about ±20% (plus additional errors across temperature) when digitizing the value of a resistor using a reference resistor fabricated on an IC.

Alternatively, a discrete reference resistor of high accuracy and low temperature coefficient could be used, external to the IC. However, a disadvantage of this approach is that it requires that an I/O pin on the IC be available for connection to the external reference resistor (in addition to the pin necessary to connect the resistor to be digitized).

If a dedicated reference resistor is to be avoided, two possible approaches to digitizing a resistance are to force a current into the resistor and digitize the resulting voltage, and to force a voltage across the resistor and digitize the resulting current. The application of either of these two approaches can be difficult in the presence of a capacitance of arbitrary value shunting the resistance to be digitized. One reason is that forcing a current into the resistor is speed-limited by the RC product of the resistance and the shunt capacitance. For example, the digitization of a 200KΩ resistor with 40 nF of shunt capacitance requires almost 37 ms of settling time before the settling error is below 1%. Forcing a voltage across the resistance to be digitized enables much faster operation, assuming that the Thévenin equivalent of the subcircuit used to force the voltage has a small output impedance. However, forcing a voltage across the resistance is best done using a feedback loop, the stability-compensation of which will have to contend with the difficulties of the pole introduced by a shunt capacitance of arbitrary value.

Note that, though an R-to-D converter has been discussed, problems of a similar nature can affect converters designed to digitize other parameters of unknown value, such as a voltage or current.

SUMMARY OF THE INVENTION

A system for digitizing a parameter having an unknown value is presented which overcomes the problems noted above. When compared with a conventional R-to-D converter, for example, the present system requires no dedicated reference resistors and suffers from no stability-compensation difficulties.

The present digitizing system is used to digitize the magnitude of a first parameter, which can be inferred by applying to the first parameter a second parameter having a second magnitude and digitizing the magnitude of a resulting third parameter (referred to herein as the "third magnitude"). The circuit which applies the second parameter has an associated bias point which is dependent on the magnitude of the first parameter and with which the magnitude of the second parameter varies.

One characteristic of the present system is that the magnitude of the first parameter can result in an error in the magnitude of the second parameter which results in an error being incurred when the digitized value of the third magnitude is used to infer a digitized value of the magnitude of the first parameter. This potential source of error is avoided by employing a digitizing system as described herein, which includes a sequential-trial analog-to-digital converter (ADC). The system is arranged to adjust the bias point of the circuit which applies the second parameter with each successive trial and to have the ADC perform sequential comparisons between the third magnitude and respective decision thresholds, such that there is no error in the magnitude of the second parameter when the third magnitude is equal to the decision threshold for a particular trial, and therefore we can infer, without incurring any error, a digitized value of the first parameter from the digitized value of the third parameter.

A system per the present invention can be used to digitize any one of a number of parameter types, including resistance, voltage or current. For example, an R-to-D converter can be provided by forcing a voltage across the unknown resistance and digitizing the resulting current with a sequential-trial current-input ADC, or by forcing a current across the unknown resistance and digitizing the resulting voltage with a sequential-trial voltage-input ADC; a V-to-D converter can be provided by forcing the unknown voltage across a resistor of known value and digitizing the resulting current with a sequential-trial current-input ADC; an I-to-D converter can be provided by forcing the unknown current through a resistor of known value and digitizing the resulting voltage with a sequential-trial voltage-input ADC.

In a preferred R-to-D converter embodiment, the digitizing system employs a voltage forcing circuit that includes a feedback loop operated at a given bias current to set an internal node voltage. An open-loop replica of this voltage is forced across the resistance to be digitized. A sequential-trial current-input ADC adjusts the bias current at which the feedback loop is operated (which serves to adjust the bias point of the circuit which applies the second parameter) with each successive trial, and determines whether the current conducted by the resistor in response to the replicated internal node voltage is greater or less than a threshold current for each successive trial. The resistance is digitized based on the results of these trials.

These and other features, aspects, and advantages of the present invention will become better understood with reference to the following drawings, description, and claims.

DETAILED DESCRIPTION OF THE INVENTION

The present digitizing system is used to digitize the magnitude of a first parameter, which can be inferred by applying to the first parameter a second parameter having a second magnitude and digitizing the magnitude of a resulting third parameter. Though the present system can be designed to digitize any one of a number of parameter types, including resistance, voltage or current, a resistance-to-digital (R-to-D) converter is used as an illustrative embodiment herein.

As discussed above, one possible approach to digitizing a resistance is to force a voltage across the resistor and digitize the resulting current. However, the application of this approach is difficult in the presence of a capacitance of arbitrary value shunting the resistance to be digitized. Forcing a voltage across the resistance can be accurately done using a feedback loop; for example, an operational amplifier (op amp) can be used to drive the control terminal of a transistor connected in a follower configuration (referred to herein as a "follower transistor"), the output of which is fed back to an input of the op amp and applied across the resistance. However, the stability-compensation of such a loop will have to contend with the difficulties of a pole introduced by a shunt capacitance of arbitrary value.

Figures 1, 2:
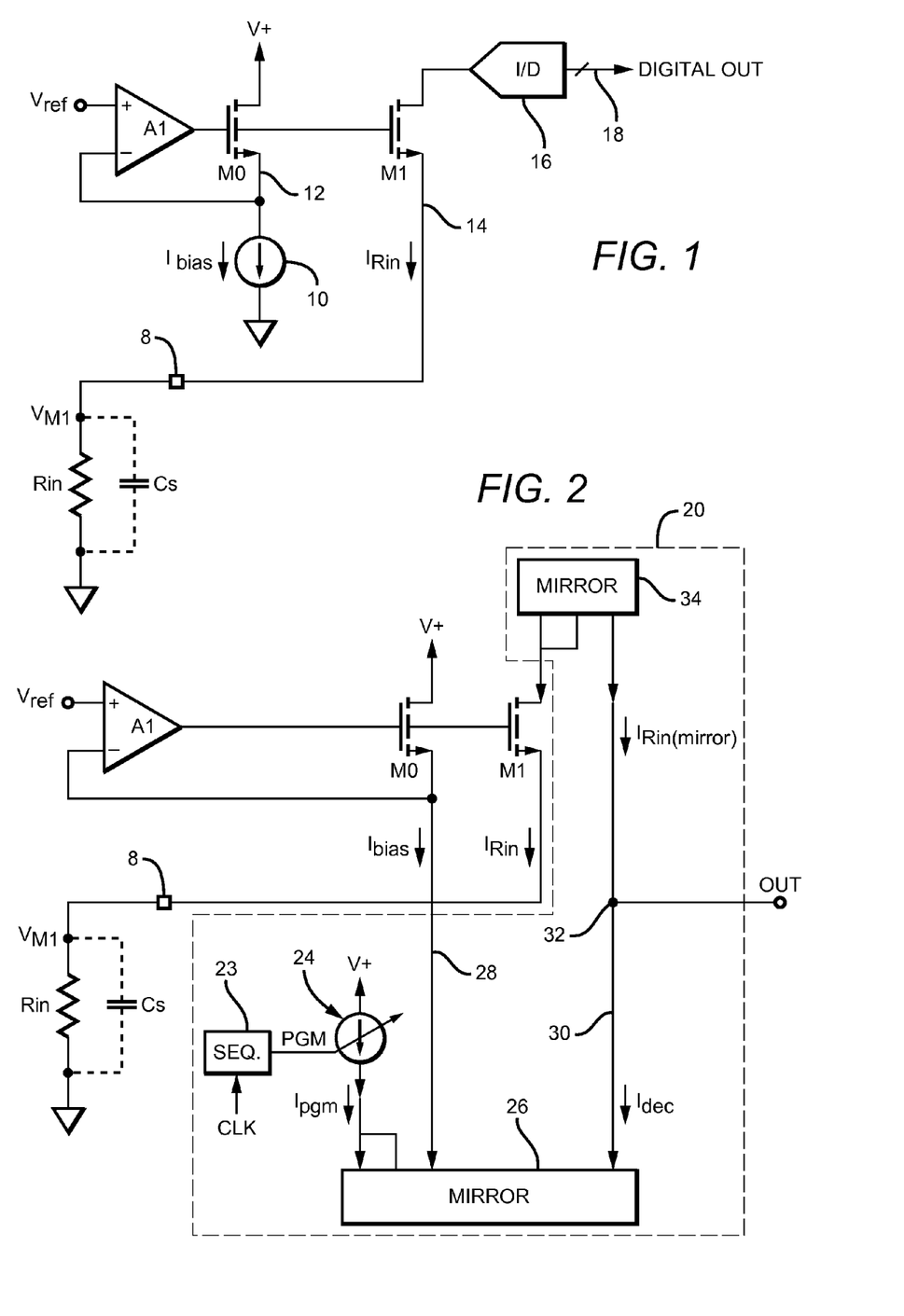
FIG. 1 is a block/schematic diagram of one possible embodiment of an R-to-D converter.
FIG. 2 is a block/schematic diagram of an R-to-D converter in accordance with the present invention.

The stability-compensation difficulties of the force-voltage approach can be circumvented by forcing the voltage with an open-loop replica of the follower transistor; one possible arrangement is illustrated in FIG. 1. Here, the resistance to be digitized is labeled as Rin, and the shunt capacitance of arbitrary value across Rin is labeled Cs. In some applications, resistance Rin is implemented with an external resistor connected to an I/O pin of an integrated circuit (IC); such an I/O pin is represented in FIG. 1 with a square 8. A voltage is forced across Rin with a voltage-forcing circuit which comprises an op amp A1, a follower transistor M0, a second transistor M1, and a fixed current source 10. A1 receives a reference voltage $V_{ref}$ at one input, and drives the control terminal of follower transistor M0 with its output; M0 is biased with a current $I_{bias}$ provided by fixed current source 10; the output 12 of M0 is fed back to A1's other input such that A1, M0 and current source 10 are connected in a negative feedback configuration.

The open-loop replica of the follower transistor is provided with second transistor M1 which is also driven by the output of A1, with its output 14 connected to apply a voltage $V_{M1}$ to the top of Rin; this results in M1—and thus Rin—conducting a current $I_{Rin}$. Current $I_{Rin}$ is connected to a current-to-digital converter 16, which produces a digital output value 18 that varies with $I_{Rin}$, which is given by $V_{M1}$/Rin. Thus, if $I_{Rin}$ and $V_{M1}$ are known, Rin can be calculated from Rin=$V_{M1}$/$I_{Rin}$.

In operation, the negative feedback loop comprised of A1, M0 and current source 10 operates to make the voltage at the source 12 of M0—referred to herein as the 'internal node voltage'—approximately equal to $V_{ref}$, with the current conducted by M0 (M0's drain-to-source current) equal to $I_{Bias}$—Since M1 is also driven by A1, the voltage at its source ($V_{M1}$) is ideally also equal to $V_{ref}$. If this were the case in practice, Rin could be accurately calculated from Rin=$V_{M1}$/$I_{Rin}$, since $V_{ref}$ is known and $I_{Rin}$ can be accurately measured with current-to-digital converter 16.

However, in practice, $V_{M1}$ may not be equal to $V_{ref}$. If M0 and M1 are NMOS FETs, as shown in FIG. 1, operated in saturation and fabricated in the same technology and having the same nominal dimensions, $V_{M1}$ will be substantially equal to $V_{ref}$ when the drain-to-source current of M0 is equal to that of M1. This is so because identical drain-to-source currents would result in nominally-identical overdrive voltages (Vgs–Vth), and since the gates of M0 and M1 are at the same potential, their source voltages—and thus $V_{M1}$ and $V_{ref}$—would be nominally-identical.

Unfortunately, it is unlikely that M0's and M1's source voltages will be equal, due to the fact that the two transistors are likely to have unequal drain-to-source currents. M0's drain-to-source current is effectively equal to current $I_{bias}$ (by virtue of the negative feedback loop), while the drain-to-source current for M1 will be equal to $V_{M1}$ (which is roughly equal to $V_{ref}$) divided by Rin. Thus, while the drain-to-source current for M0 is fixed (and equal to $I_{bias}$), the drain-to-source current for M1 depends (roughly inversely proportionally) on the value of the resistance (Rin) being digitized. Since Rin is unknown, there is a likelihood that there will be a difference in the drain-to-source currents of M0 and M1, which results in different source voltages, which causes the voltage $V_{M1}$ established across Rin to be different from $V_{ref}$.

The present parameter digitizing system reduces or eliminates error of this sort. In general, to digitize a first parameter having a first magnitude, the value of which can be inferred by applying a second parameter having a second magnitude to the first parameter, a circuit is used to apply the second parameter having the second magnitude to the first parameter, resulting in a parameter having a third magnitude. The circuit is characterized in that it has an associated bias point which is dependent on the magnitude of the first parameter and with which the magnitude of the second parameter varies. The system is arranged to adjust the bias point of the circuit which applies the second parameter with each successive trial and to have a sequential-trial ADC perform sequential comparisons between the third magnitude and respective decision thresholds, such that there is no error in the magnitude of the second parameter when the third magnitude is equal to the decision threshold for a particular trial, and therefore we can infer, without incurring any error, a digitized value of the first parameter from the digitized value of the third parameter. The adjustment of the bias point with each successive trial may be performed by the ADC, or by other circuitry separate from the ADC; the discussion below assumes the former, though this is not essential.

An R-to-D converter in accordance with the present digitizing system substantially reduces or eliminates the source of error described above; a block/schematic diagram which illustrates the principles of the present converter is shown in FIG. 2. This exemplary embodiment employs a voltage-force approach, which suffers from neither the stability-compensation nor the mismatched-overdrive voltage issues discussed above. The general operation of the converter is as follows: as in FIG. 1, a feedback loop is operated at a given bias current to set an internal node voltage, and an open-loop replica of this voltage is forced across the resistance to be digitized. Then, a sequential-trial current-input ADC is arranged to adjust the bias current with each successive trial by making it proportional to the ADC's "decision threshold current" (discussed below) for that particular trial, and to determine whether the current conducted by the resistance in response to the replicated internal node voltage is greater than or less than the decision threshold current; the results of these comparisons serve to establish a digital value for Rin. When properly arranged, the R-to-D converter has absolutely no error in its transfer function—i.e., the converter will always provide the correct digital output for any resistance to be digitized.

As in FIG. 1, a voltage-forcing circuit is made from op amp A1, follower transistor M0 biased with a current $I_{bias}$, and second transistor M1, which operates to force a voltage $V_{M1}$ across Rin and shunt capacitance Cs; M0 and M1 are operated in their saturation region. The converter also includes a sequential-trial current-input ADC 20 arranged to adjust $I_{bias}$ with each successive trial, and to determine whether the current conducted by the resistance to be digitized ($I_{Rin}$) in response to the replicated internal node voltage ($V_{M1}$) is greater or less than a decision threshold current $I_{dec}$.

The sequential-trial current-input ADC could be implemented in many different ways; one possible embodiment is shown in FIG. 2. The ADC includes a programmable current source 24 arranged to output different fixed currents $I_{pgm}$ with each successive trial in response to a programming signal PGM received from a clock-driven sequencer 23. A first current mirror 26 is arranged to mirror $I_{pgm}$ to first and second outputs 28, 30, with the current conducted at first output 28 being bias current $I_{bias}$ and the current conducted at second output 30 connected to a comparison node 32 and being decision threshold current $I_{dec}$. A second current mirror 34 is arranged to mirror the current $I_{Rin}$ to comparison node 32 as a current $I_{Rin(mirror)}$. $I_{bias}$ will be considered to be equal to $I_{dec}$ md and $I_{pgm}$ in the discussion below, though current mirror 26 might alternatively be arranged such that the ratios of $I_{pgm}$ to $I_{bias}$ and $I_{pgm}$ to $I_{dec}$ are not 1:1. Similarly, $I_{Rin}$ will be considered to be equal to $I_{Rin(mirror)}$, though current mirror 34 could be arranged such that the ratio of $I_{Rin}$ to $I_{Rin(mirror)}$ is something other than 1:1. It is also being assumed that transistors M0 and M1 are of the same size.

Comparison node 32 serves as the ADC output, with the voltage at the comparison node indicating whether the current conducted by Rin in response to replicated internal node voltage $V_{M1}$, as mirrored to node 32, is greater than or less than $I_{dec}$ for each successive trial. When $I_{Rin(mirror)} > I_{dec}$, node 32 is pulled up; when $I_{Rin(mirror)} < I_{dec}$, node 32 is pulled down. Note that the output produced at node 32 may not be in the desired digital format. If that is the case, an encoder (not shown) would generally be used to convert this output to the desired ADC output format, such as a binary-weighted parallel.

When so arranged, it is not necessary that the current densities through M0 and M1 match at every trial—they only need do so for the trials that are most critical for the digitization of the particular resistance being digitized. For example, the converter may operate by performing eight trials, sequentially comparing $I_{Rin}$ against a decision threshold current of 1 µA, followed by comparisons with 2 µA, 3 µA, 4 µA, 5 µA, 6 µA, 7 µA and 8 µA. The source-voltage-related error discussed above is most deleterious when the current through Rin is close in value to a decision threshold current. For example, if $V_{ref}$/Rin (i.e., the ideal current through Rin if there were no error in the voltage established across it) is 4.1 uA, the error that exists in the voltage across the resistor ($V_{M1}$) is not likely to result in an error when $I_{Rin}$ is being compared to 1 uA, 2 uA or 3 uA, or to 5 uA, 6 uA or 7 uA. This is because $V_{ref}$/Rin and $V_{M1}$/Rin result in similar currents that would most likely yield the same answer when compared against 1 uA, 2 uA, 3 uA, 5 uA, 6 uA or 7 uA. However, when the current through Rin is being compared to 4 uA—the critical decision point under these conditions—a small error in $V_{M1}$ can make $I_{Rin}$ (ideally 4.1 uA in this example) be smaller than 4 uA. If this were the case, the 4 uA trial would yield an erroneous result. However, the present converter arrangement avoids this error because, at this critical 4 uA decision point, currents $I_{Rin}$ and $I_{Bias}$—and thus the drain-source voltages of M0 and M1—are nearly equal, such that the source voltage-related error discussed above is essentially eliminated at this decision point.

The present arrangement has little effect on source voltage-related error for trials in which $I_{Rin(mirror)}$ and $I_{dec}$ are far apart; this is irrelevant, though, as the error will not change the result of the comparisons performed during these non-critical trials. However, the smaller the difference between $I_{Rin(mirror)}$ and $I_{dec}$ is for a given trial, the smaller the magnitude of the source-voltage-related error would be, with the source voltage-related error becoming essentially zero at the critical decision point.

Figure 3:
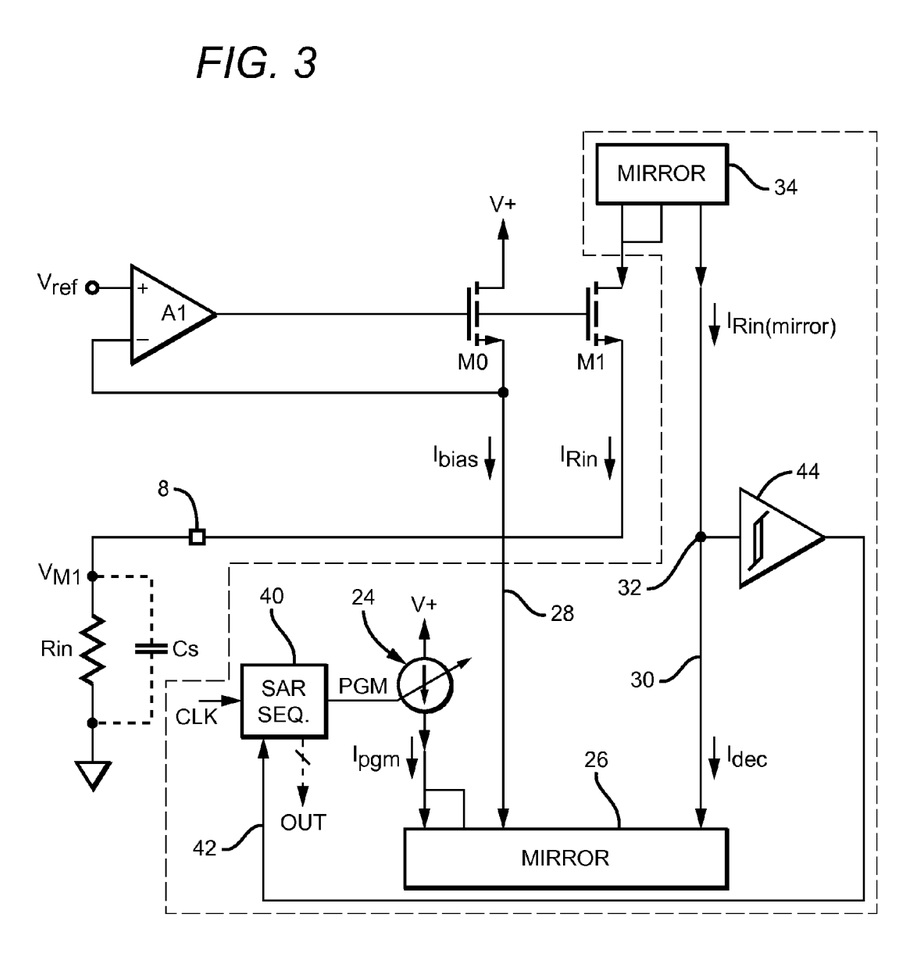
FIG. 3 is a block/schematic diagram of a preferred embodiment of an R-to-D converter in accordance with the present invention.

A preferred embodiment of a sequential-trial current-input ADC in accordance with the present invention is shown in FIG. 3. Here, programming signal PGM is provided by a successive approximation register (SAR) sequencer 40 arranged to receive a clock signal CLK (preferably provided by a clock generator, not shown) and a signal 42 which varies with the voltage at comparison node 32 at respective inputs, and to provide programming signal PGM to programmable current source 24 in response. Since SAR sequencer 40 receives signal 42 which indicates the results of each trial, it can be further arranged to produce the converter's digital output signal OUT, which provides a digital representation of the resistance to be digitized.

Note that it is not essential that $I_{Rin(mirror)}$ be sequentially compared with monotonically decreasing or increasing decision threshold currents such as 1 uA, 2 uA, 3 uA, 4 uA, 5 uA, 6 uA, and 7 uA as described above. A SAR sequencer typically would perform a binary search so that for the example provided (three-bit quantization), only three comparisons to obtain the same resolution would be necessary. For example, a first comparison would be made against the middle of the scale (4 uA). If the input is lower than 4 uA, a second trial compares the input to the middle of the lower half of the scale (2 uA); if greater than 4 uA, then against the middle of the top half of the scale (6 uA). This is why it is necessary that signal 42 be fed back to SAR sequencer 40, as the results of the previous comparison must be known.

The sequential-trial current-input ADC preferably also includes a Schmitt trigger circuit 44, the input of which is connected to comparison node 32 and the output of which provides signal 42 to the SAR sequencer, such that the signal 42 indicates whether $I_{Rin(mirror)}$ is greater or less than $L_{en}$. Use of a Schmitt trigger circuit provides several benefits. For example, the Schmitt trigger output will be a reliable logic high or logic low as appropriate. A Schmitt trigger also serves to reject noise, which is particularly important when the magnitudes of $I_{Rin(mirror)}$ and $I_{dec}$ are particularly close.

Figure 4A:
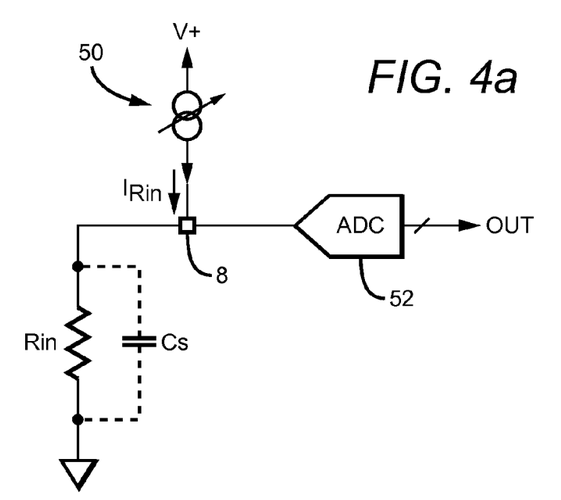
FIG. 4a illustrates an R-to-D converter which employs current-forcing.

FIGS. 1-3 illustrate the use of a voltage-forcing approach, in which a voltage is forced across the parameter to be digitized, and the resulting current is measured. However, this is just one possible way of implementing a digitizing system in accordance with the present invention. For example, a current-forcing approach might also be used. The principles of such an approach as applied to an R-to-D converter are shown in FIG. 4a, with a detailed schematic of one possible implementation shown in FIG. 4b. In FIG. 4a, a programmable current source 50 applies a sequence of fixed currents $I_{Rin}$ to the resistance to be digitized (Rin), and the resulting voltage is digitized with an ADC 52; the digitized voltage would vary with the value of Rin.

Figure 4B:
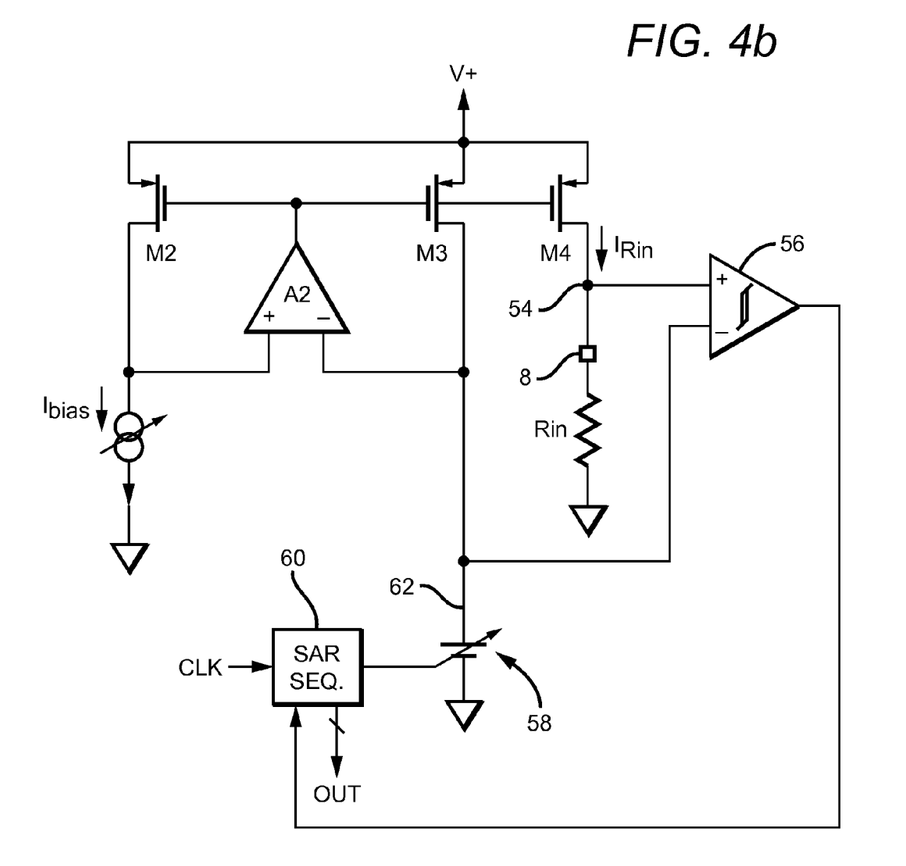
FIG. 4b illustrates an R-to-D converter in accordance with the present invention which employs current-forcing.

However, due to the output impedance of the non-ideal current source 50, the value of the current applied to Rin is influenced by the value of the Rin. This can be overcome with the use of a digitizer as described herein which includes a sequential trial voltage-input ADC; one possible implementation is shown in FIG. 4b. Three PMOS FETs M2, M3, M4 and an amplifier A2 which drives their gates form a high-accuracy mirror which forces a current $I_{Rin}$ through Rin. This causes a voltage to develop at node 54, which is applied to one input of a comparator 56. A programmable voltage source 58 (which performs the same function as the programmable current source in FIGS. 2-3), preferably controlled with a SAR sequencer 60, provides a voltage output 62 which 1) is connected to the other input of comparator 56, and 2) provides a means for the mirror to output on M4 a current that, for each trial, has no error with respect to $I_{bias}$ if the voltage at node 54 has the exact same value as the decision threshold voltage (62) for that trial.

Figure 5A:
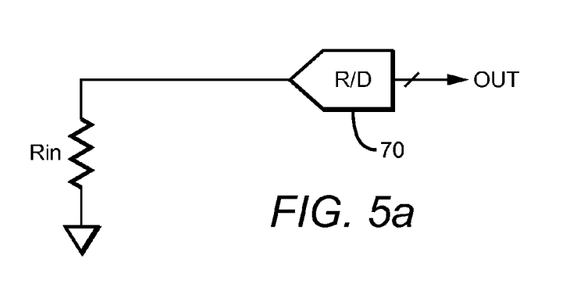
FIGS. 5a and 5b illustrate a general and a specific application, respectively, for an R-to-D converter in accordance with the present invention.
Figure 5B:
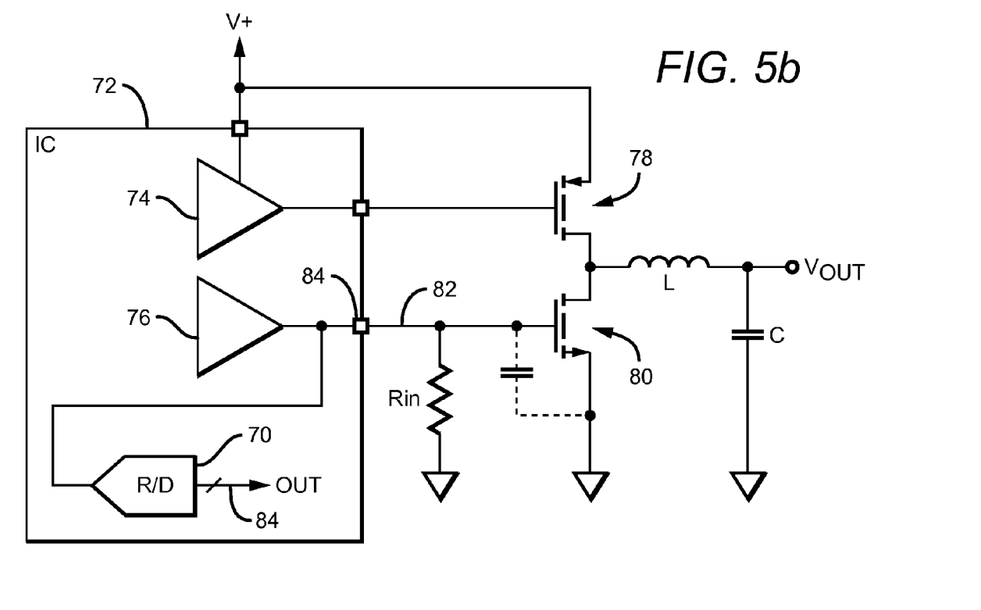

A converter as described herein, such as an R-to-D converter, is generally applicable any time there is a need to digitize the magnitude of a first parameter which can be inferred by applying to the first parameter a second parameter having a second magnitude. This is generally illustrated in FIG. 5a, in which an R-to-D converter 70 as described herein is connected to a resistance Rin to be digitized. Such a converter is particularly well-suited for use in determining the value of a resistor used as a means to configure an integrated circuit (IC) which includes 'primary' circuitry such as a DC/DC controller, with parameters such as the controller's switching frequency or control scheme determined by the value of the resistor. This is illustrated in FIG. 5b. An IC 72 contains drivers 74, 76 which drive respective off-chip switching transistors 78, 80 to which an output inductor L and capacitor C are coupled. The IC is configured by means of a resistor Rin, which in this exemplary embodiment is connected to the gate of low-side switching transistor 80; the gate of transistor 80 presents an unknown arbitrary capacitance in shunt with resistor Rin. To sense the value of Rin and thereby configure the IC based on the digitized resistance, an R-to-D converter 70 as described herein is provided on-chip, with its input connected to the gate of transistor 80. The digitized resistance is provided at an output 84, which would be coupled to circuitry (not shown) to configure the IC.

An advantage of this approach is that it does not require a dedicated I/O pin to connect the resistor to be digitized—the I/O pin 84 to which R-to-D converter 70 is connected is already needed to drive transistor 80. It should be noted that it is not essential that the configuration resistor be connected between the gate of transistor 80 and ground—a converter per the present invention could be configured to digitize a resistor connected between, for example, the gate of transistor 80 and supply voltage V+, or between the gate of transistor 78 and either ground or V+.

As noted above, the present digitizing system has a general applicability, in that it can be used to digitize parameters other than resistance; in fact, the present system can be designed to digitize any of a number of parameter types, including voltage or current, so long as the magnitude of the parameter can be inferred by applying a second parameter to the first parameter and digitizing the magnitude of the third parameter that results.

Figure 6A:
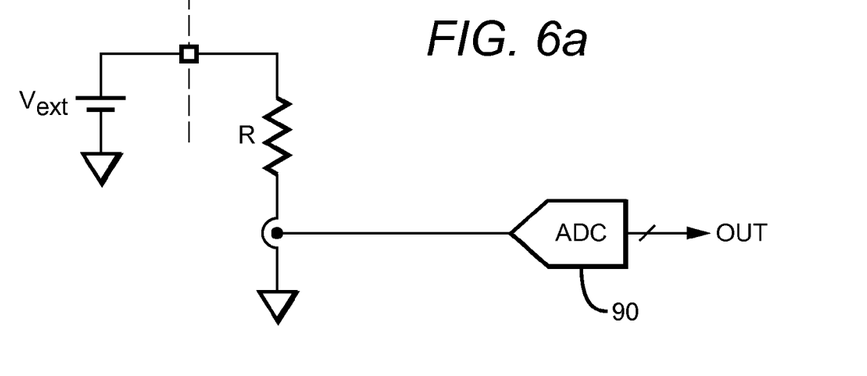
FIG. 6a illustrates a voltage-to-digital converter which employs resistance-forcing.
Figure 6B:
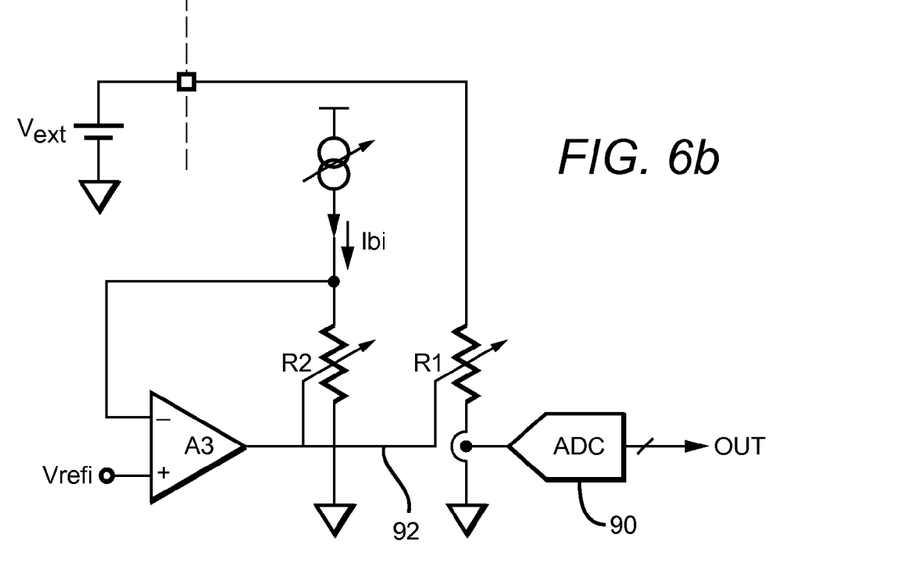
FIG. 6b illustrates a voltage-to-digital converter in accordance with the present invention which employs resistance-forcing.

An example of how the present system might be used to digitize a voltage by applying a resistance and digitizing the resulting current is illustrated in FIGS. 6a and 6b. FIG. 6a is a block diagram of a circuit that can digitize a voltage Vext (on the left of the dashed line) by applying a known resistance R and digitizing the resulting current through R with a current-input ADC 90. However, the resistor may be non-linear and the value of resistance R may vary with the voltage (Vext) across it: for example, the voltage across R can impact the temperature of the resistor, which in turn can affect its resistance. This dependence would result in an error on the inferred digitized value of Vext.

In FIG. 6b, the concept of the present digitizing system is employed to reduce this source of error. A resistance R1 across which voltage Vext is dropped is a controlled resistance that has its control terminal 92 connected so as to make R1 be the replica of another controlled resistance R2. A bias current Ibi is connected to R2, which is connected in a feedback loop with an amplifier A3 which receives a reference voltage Vrefi at its other input; A3 drives R2's control terminal to make its resistance have a desired value Rdesired (=Vrefi/Ibi). On every trial, the values of Vrefi and Ibi are changed so that a resistor of value Rdesired is obtained, but using the Ibi that corresponds to the decision point of that particular trial. By doing this, if the external voltage to be digitized produces a current in R1 equal to the current against which the input of current-input ADC 90 will be compared in a particular trial, resistances R1 and R2 will have the same current through them and the error (in this case the difference in resistance between R1 and R2), would be zero.

Figure 7A:
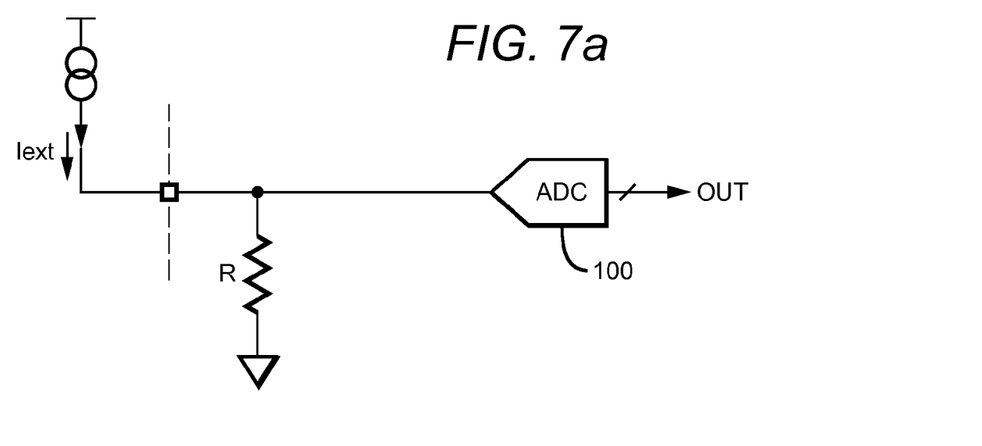
FIG. 7a illustrates a current-to-digital converter which employs resistance-forcing.
Figure 7B:
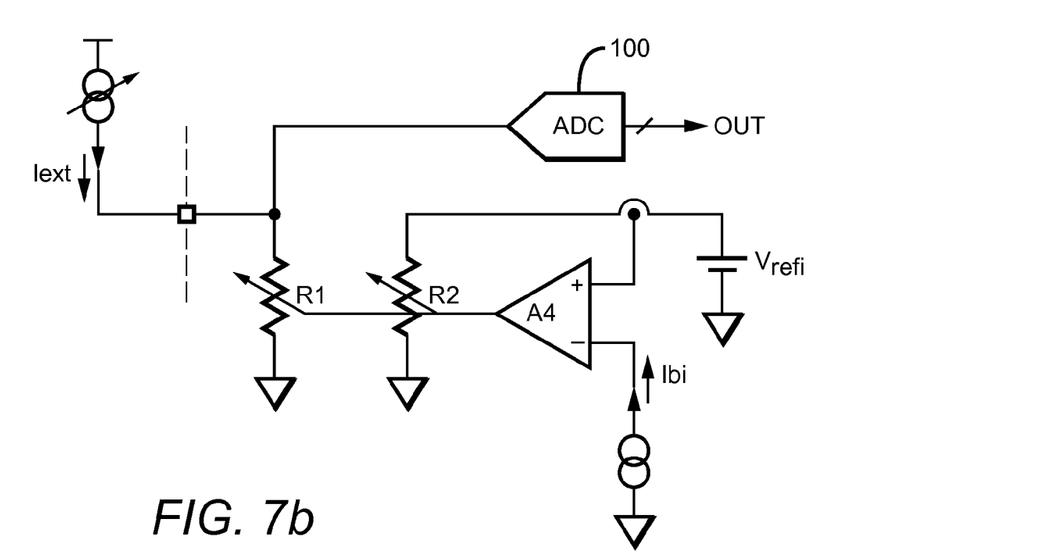
FIG. 7b illustrates a current-to-digital converter in accordance with the present invention which employs resistance-forcing.

Similarly, FIG. 7a represents a circuit that digitizes an external current Iext by applying a resistance R and digitizing the resulting voltage across that resistor with a voltage-input ADC 100. However, the resistor is likely to have some form of non-linearity, such as having a resistance that depends on the current through it because the current influences the temperature of the resistor, and hence the current through the resistor will result in an error in the inferred digitized current. FIG. 7b corrects that error by again using an internal feedback loop made from an amplifier A4 (this time with inverting and non-inverting inputs being current inputs, rather than voltage inputs), a resistance R2 and a reference voltage Vrefi to synthesize a resistance, and using a replica of that resistance (R1) to sense the current Iext to be digitized. In accordance with the present invention, the values of Vrefi and Ibi are changed on each trial to ensure that if Iext corresponds to the decision point for that particular trial, resistances R2 and R1 have no difference in value, and hence no error is introduced in the value of the inferred digitized current.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A converter circuit for digitizing the magnitude of a first parameter, which can be inferred by applying to the first parameter a second parameter having a nominal second magnitude and digitizing the magnitude of a resulting third parameter, comprising:
a parameter-applying circuit which applies said second parameter having said second magnitude to said first parameter, said converter circuit arranged such that the value of said first parameter can result in the actual value of said second parameter differing from said nominal value, which results in an error being incurred when the digitized value of the third magnitude is used to infer a digitized value of the magnitude of said first parameter, said parameter-applying circuit having an associated bias point with which the actual magnitude of said second parameter also varies; and a sequential-trial analog-to-digital converter (ADC), said converter circuit arranged to adjust the bias point of the parameter-applying circuit with each successive trial and said ADC arranged to perform sequential comparisons between said third magnitude and respective decision thresholds which are different for each of said comparisons, such that there is no error in the actual magnitude of the second parameter when the third magnitude is equal to the decision threshold for a particular trial, and therefore a digitized value of the first parameter can be inferred from the digitized value of the third parameter without incurring any error.

2. The converter circuit of claim 1, wherein said first parameter is resistance, said second parameter is voltage, said third parameter is current, and said ADC is a sequential-trial current-input ADC.

3. The converter circuit of claim 1, wherein said first parameter is resistance, said second parameter is current, said third parameter is voltage, and said ADC is a sequential-trial voltage-input ADC.

4. A resistance-to-digital converter, comprising:
a voltage-forcing circuit, comprising:
a feedback loop arranged to operate at a given bias current to set an internal node voltage; and
a circuit which produces an open loop replica of said internal node voltage, said replicated internal node voltage forced across a resistance to be digitized; and
a sequential-trial current-input analog-to-digital converter (ADC), said converter arranged to adjust said bias current with each successive trial and said ADC arranged to determine whether the current conducted by said resistance to be digitized in response to said replicated internal node voltage is greater or less than a decision threshold current which is different for each successive trial.

5. The converter of claim 4, wherein said voltage-forcing circuit comprises:
a reference voltage;
an operational amplifier having first and second inputs and an output, said reference voltage connected to one of said inputs; and
a follower transistor connected such that it is driven by said amplifier output to conduct said bias current, the output of said follower transistor connected to the other of said amplifier's inputs such that the voltage at said follower transistor output is approximately equal to said reference voltage, said voltage at said follower transistor output being said internal node voltage.

6. The converter of claim 5, wherein said circuit which produces an open loop replica of said internal node voltage comprises a second transistor connected such that it is driven by said amplifier to conduct the current conducted by said resistance to be digitized.

7. The converter of claim 4, wherein said sequential-trial current-input ADC comprises:
a sequencer arranged to provide a programming signal at an output in response to a clock signal;

a programmable current source arranged to output different fixed currents with each successive trial in response to said programming signal;
a first current minor arranged to mirror the current provided by said programmable current source to first and second outputs, the current conducted at said first output being said bias current and the current conducted at said second output connected to a comparison node and being said decision threshold current; and
a second current mirror arranged to minor the current conducted by said resistance to be digitized to said comparison node, such that the voltage at said comparison node indicates whether the mirrored current from said second current minor is greater than or less than said decision threshold current for each successive trial.

8. The converter of claim 7, further comprising a Schmitt trigger connected to said comparison node at its input, such that said Schmitt trigger's output indicates whether the mirrored current from said second current minor is greater than or less than said decision threshold current for each successive trial.

9. The converter of claim 7, further comprising a clock generator which produces said clock signal;
wherein said sequencer comprises:
a successive approximation register (SAR) sequencer arranged to:
receive an input which varies with the voltage at said comparison node;
provide said programming signal to said programmable current source in response to said input and said clock signal; and
provide a digital output that represents the resistance to be digitized.

10. The converter of claim 4, further comprising a resistance to be digitized.

11. The converter of claim 10, wherein said resistance to be digitized is externally connected to an I/O pin of an integrated circuit (IC) which contains primary circuitry, said resistance-to-digital converter being internal to said IC along with said primary circuitry.

12. The converter of claim 11, wherein said IC is arranged such that the mode of operation of said primary circuitry is determined by the value of said resistance to be digitized.

13. The converter of claim 11, wherein the I/O pin to which said resistance to be digitized is connected is an existing pin which is required by said primary circuitry.

14. The converter of claim 11, wherein said IC is a DC/DC controller.

15. A resistance-to-digital converter, comprising:
a current-forcing circuit, comprising:
a feedback loop arranged to operate at a given bias voltage to set an internal current; and
a circuit which produces an open loop replica of said internal current, said replicated internal current forced across a resistance to be digitized; and
a sequential-trial voltage-input analog-to-digital converter (ADC), said converter arranged to adjust said bias voltage with each successive trial and said ADC arranged to determine whether the voltage across said resistance to be digitized in response to said replicated internal node current is greater or less than a decision threshold voltage which is different for each successive trial.

16. A resistance-to-digital converter, comprising:
a voltage-forcing circuit, comprising:
a reference voltage;

an operational amplifier having first and second inputs and an output, said reference voltage connected to one of said inputs; and a follower transistor connected such that it is driven by said amplifier output to conduct a bias current, the output of said follower transistor connected to the other of said amplifier's inputs such that the voltage at said follower transistor output is approximately equal to said reference voltage;

a second transistor connected such that it is driven by said amplifier to produce an open loop replica of the voltage at said follower transistor output, said replicated voltage forced across a resistance to be digitized such that said second transistor conducts the current conducted by said resistance; and a sequential-trial current-input analog-to-digital converter (ADC) comprising:

a sequencer arranged to provide a programming signal at an output in response to a clock signal;

a programmable current source arranged to output different fixed currents with each successive trial in response to said programming signal;

a first current mirror arranged to mirror the current provided by said programmable current source to first and second outputs, the current conducted at said first output being said bias current and the current conducted at said second output connected to a comparison node and being a decision threshold current;

a second current mirror arranged to mirror the current conducted by said resistance to be digitized to said comparison node; and a Schmitt trigger connected to said comparison node at its input such that said Schmitt trigger's output indicates whether the mirrored current from said second current mirror is greater than or less than said decision threshold current for each successive trial.

17. The converter of claim 16, further comprising a clock generator which produces a clock signal;

wherein said sequencer comprises a successive approximation register (SAR) sequencer arranged to:

receive an input that varies with the output of said Schmitt trigger;

provide said programming signal to said programmable current source in response to said input and said clock signal; and provide a digital output that represents the resistance to be digitized.

18. The converter of claim 16, wherein said follower and second transistors are NMOS transistors, said converter arranged such that said NMOS transistors operate in their saturation regions when said converter is in use.

* * * * *